United States Patent
Maniwa et al.

(10) Patent No.: US 9,059,664 B2
(45) Date of Patent: Jun. 16, 2015

(54) AMPLIFIER (71) Applicant: FUJITSU LIMITED, Kawasaki (JP)

(72) Inventors: Toru Maniwa, Kawasaki (JP); Shigekazu Kimura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 36 days.

(21) Appl. No.: 13/663,963

(22) Filed: Oct. 30, 2012

(65) Prior Publication Data
US 2013/0147549 A1 Jun. 13, 2013

(30) Foreign Application Priority Data
Dec. 8, 2011 (JP) ................. 2011-269365

(51) Int. Cl.
H03F 3/68 (2006.01)
H03F 1/02 (2006.01)
H03F 1/32 (2006.01)

(52) U.S. Cl.
CPC ............... H03F 1/0294 (2013.01); H03F 1/32 (2013.01)
USPC ................................................. 330/124 R (58) Field of Classification Search
CPC .................... H03F 3/68; H03F 1/0294
USPC ............................. 330/124 R, 295
See application file for complete search history.

(56) References Cited

U.S. PATENT DOCUMENTS

| 5,264,807 A * | 11/1993 | Okubo et al. ............... 330/295 |
| 5,287,069 A | 2/1994 | Okubo et al. |
| 2004/0000938 A1 | 1/2004 | Ballantyne |
| 2004/0185805 A1 | 9/2004 | Kim et al. |

FOREIGN PATENT DOCUMENTS

| JP | 3-232306 | 10/1991 |
| JP | 2002-84146 A | 3/2002 |
| JP | 2008-518514 | 5/2008 |
| WO | 97/24798 | 7/1997 |
| WO | 2006/047377 A2 | 5/2006 |

OTHER PUBLICATIONS

Korean Office Action mailed Oct. 8, 2013 for corresponding Korean Application No. 10-2012-122082, with Partial English-language Translation.
EESR—Extended European Search Report dated Sep. 2, 2014 issued with respect to the corresponding European Patent Application No. 12190510.3.
JPOA—Office Action mailed on Mar. 31, 2015 issued with respect to the basic Japanese Patent Application No. 2011-269365, with partial English translation.

* cited by examiner

Primary Examiner — Steven J Mottola
(74) Attorney, Agent, or Firm — Fujitsu Patent Center (57) ABSTRACT An amplifier includes a signal processing circuit configured to generate an orthogonal signal orthogonal to an input signal; a first D/A converter configured to convert the orthogonal signal into a first analog signal; a second D/A converter configured to convert the input signal into a second analog signal; and an analog computing circuit configured to generate a constant envelope signal based on the first analog signal from the first D/A converter and the second analog signal from the second D/A converter.

15 Claims, 12 Drawing Sheets

AMPLIFIER

CROSS-REFERENCE TO RELATED APPLICATION

This patent application is based upon and claims the benefit of priority of the prior Japanese Patent Application No. 2011-269365 filed on Dec. 8, 2011, the entire contents of which are incorporated herein by reference.

FIELD

The embodiments discussed herein are related to a transmitter.

BACKGROUND

An outphasing amplification technology is known. An outphasing amplifier that executes an amplification process by the outphasing amplification technology is also referred to as a "constant envelope amplifier".

An outphasing amplifier performs vector decomposition to decompose an input signal into two signals of two constant amplitudes. That is to say, an outphasing amplifier performs amplitude phase conversion to convert an input signal into two signals. The outphasing amplifier performs D/A conversion on the two signals that have been subjected to vector decomposition, and amplifies the two signals. Then, the outphasing amplifier combines the two amplified signals. By executing such a process, the efficiency of the amplifier can be enhanced.

There is known a constant envelope linear amplifier in which the linearity of the amplifier is enhanced, in respect to a constant envelope high efficiency amplifier for enhancing the efficiency of the amplifier (see, for example, patent document 1).

Patent document 1: Japanese Laid-Open Patent Publication No. H3-232306

The outphasing amplifier performs amplitude phase conversion to convert an input signal into two signals of two constant amplitudes.

When an input signal is subjected to amplitude phase conversion to be converted into two signals of two constant amplitudes, the frequency band of the two signals obtained by amplitude phase conversion increases.

FIGS. 1A through 2C illustrate an amplitude phase conversion process.

Figure 1A:
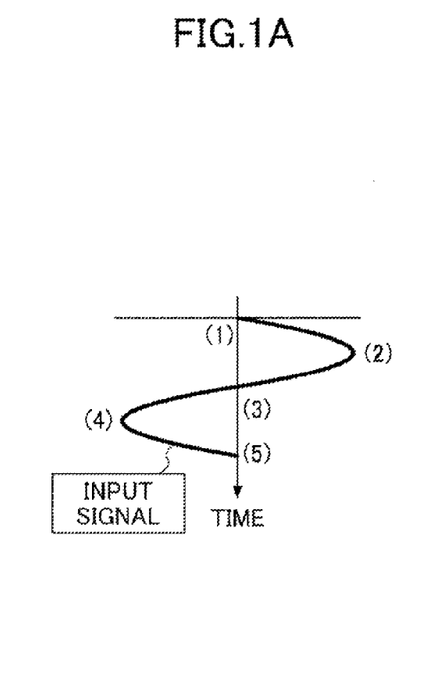
FIGS. 1A through 1C illustrate an amplitude phase conversion process.

FIG. 1A illustrates an example of an input signal. The input signal is expressed by a sine wave, and with the passage of time, the amplitude changes as indicated by (1), (2), (3), (4), and (5).

Figure 1B:
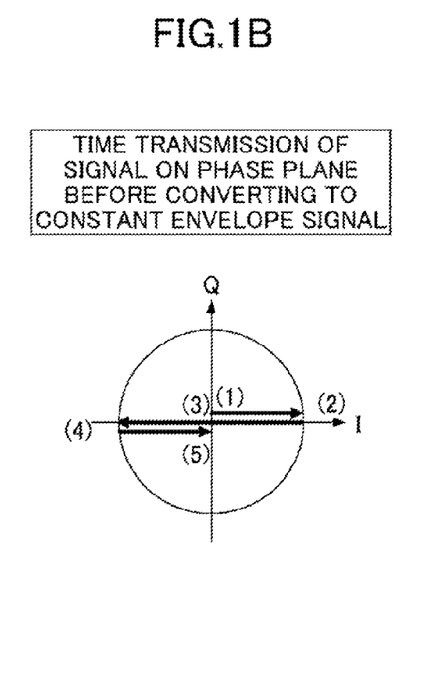

FIG. 1B illustrates an example of time transition of a signal on a phase plane. In the phase plane, it is assumed that the X axis is an I phase (In Phase) and the Y axis is a Q phase (Quadrature Phase), and the signal changes on the X axis.

Figure 1C:
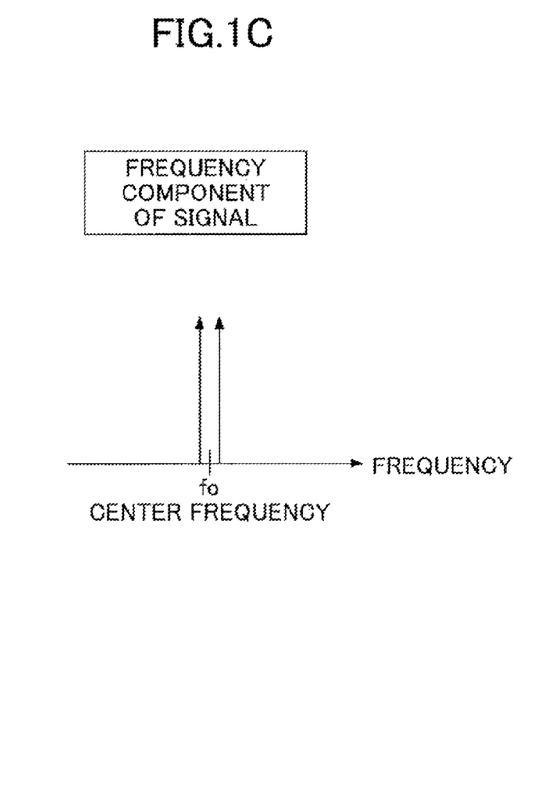

FIG. 1C illustrates an example of a frequency component of a signal. The signal changes on the I phase, and therefore the frequency component of the signal does not become wide.

Figure 2A:
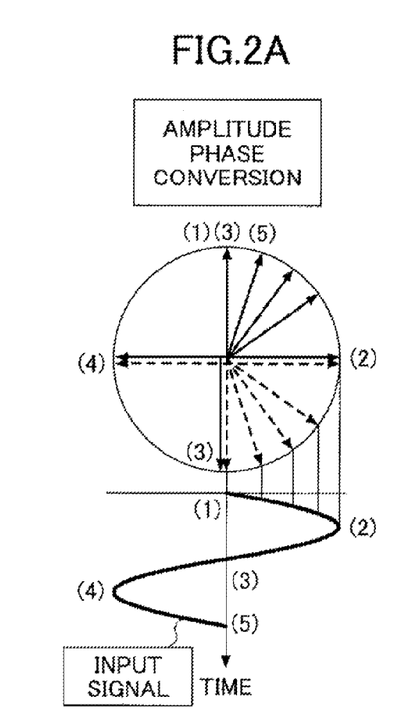
FIGS. 2A through 2C illustrate an amplitude phase conversion process.

FIG. 2A illustrates an example of a process of performing an amplitude phase conversion process on an input signal. When amplitude phase conversion is performed, the amplitude and the phase change in the order of (1), (2), (3), (4), and (5).

Figure 2B:
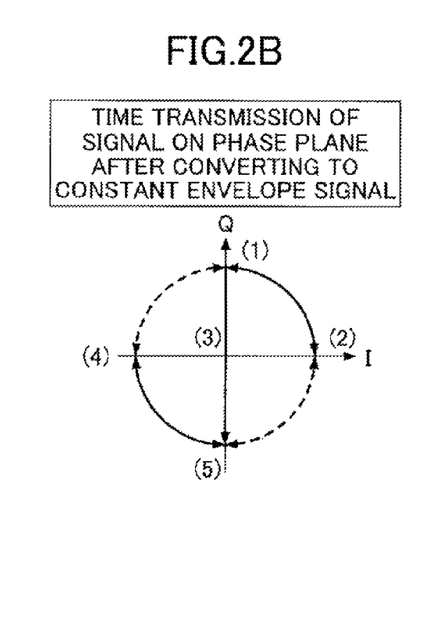

FIG. 2B illustrates an example of time transition of a signal on a phase plane. In the phase plane, it is assumed that the X axis is an I phase and the Y axis is a Q phase, and the signal changes on a plane expressed by the X axis and the Y axis.

Figure 2C:
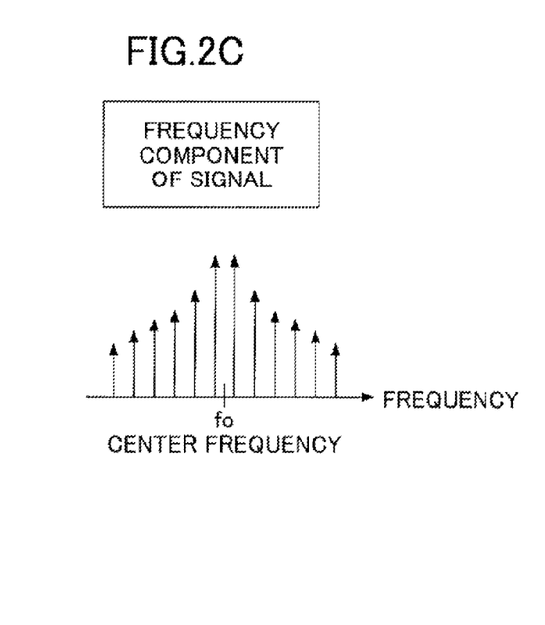

FIG. 2C illustrates an example of a frequency component of a signal. The signal changes on a plane expressed by the I phase and the Q phase, and therefore the frequency component of the signal becomes wide.

Figure 3:
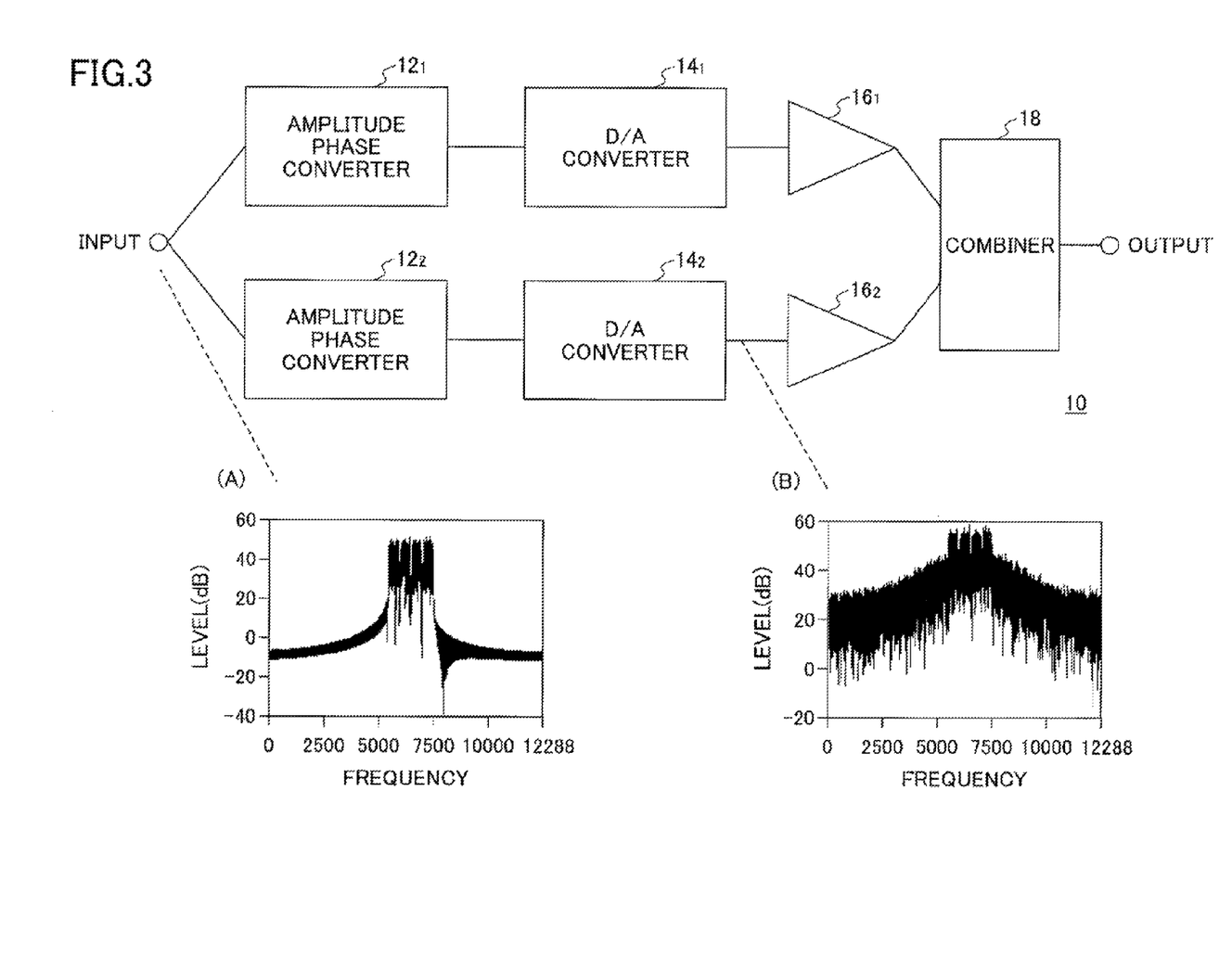
FIG. 3 illustrates an example of an amplifier circuit.

FIG. 3 illustrates an example of an amplifier circuit 10.

The amplifier circuit 10 includes amplitude phase converters $12_1$ and $12_2$, D/A converters $14_1$ and $14_2$, amplifiers $16_1$ and $16_2$, and a combiner 18.

Input signals are subjected to amplitude phase conversion by the amplitude phase converters $12_1$ and $12_2$. The input signals that have been subjected to amplitude phase conversion by the amplitude phase converters $12_1$ and $12_2$ are subjected to D/A conversion by the D/A converters $14_1$ and $14_2$.

The signals that have been subjected to D/A conversion by the D/A converters $14_1$ and $14_2$ are amplified by the amplifiers $16_1$ and $16_2$. The signals that have been amplified by the amplifiers $16_1$ and $16_2$ are combined by the combiner 18. The signals that have been combined by the combiner 18 are output.

FIG. 3 (A) illustrates a spectrum of a multicarrier modulation wave, as an example of an input signal input to the amplifier circuit 10. By being subjected to amplitude phase conversion by the amplitude phase converters $12_1$ and $12_2$, the frequency band of the input signal becomes wide. Therefore, the frequency band of the input signals converted to analog signals by the D/A converters $14_1$ and $14_2$ becomes wide. FIG. 3 (B) illustrates a spectrum of an input signal converted into an analog signal by the D/A converter $14_2$. The spectrum of an input signal converted into an analog signal by the D/A converter $14_1$ is also substantially the same as that of FIG. 3 (B).

To convert a signal of a wide band, the D/A converter needs to have a certain level of accuracy. That is to say, the D/A converter needs to have high resolution performance. Furthermore, to process signals of a wide band, the D/A converter needs to have high processing speed. That is to say, the sampling rate of the D/A converter needs to be high. Accordingly, a D/A converter having high resolution performance and a high sampling rate is needed, but it is difficult to prepare such a D/A converter.

Furthermore, when the amplifiers $16_2$ and $16_2$ have different properties, it is not possible to implement zero output. When it is not possible to implement zero output, it is not possible to use a predistorition method as a distortion compensating method.

SUMMARY

According to an aspect of the embodiments, an amplifier includes a signal processing circuit configured to generate an orthogonal signal orthogonal to an input signal; a first D/A converter configured to convert the orthogonal signal into a first analog signal; a second D/A converter configured to convert the input signal into a second analog signal; and an analog computing circuit configured to generate a constant envelope signal based on the first analog signal from the first D/A converter and the second analog signal from the second D/A converter.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

Preferred embodiments of the present invention will be explained with reference to accompanying drawings. The same elements are denoted by the same reference numerals and overlapping descriptions are omitted.

Base Station

Figure 4:
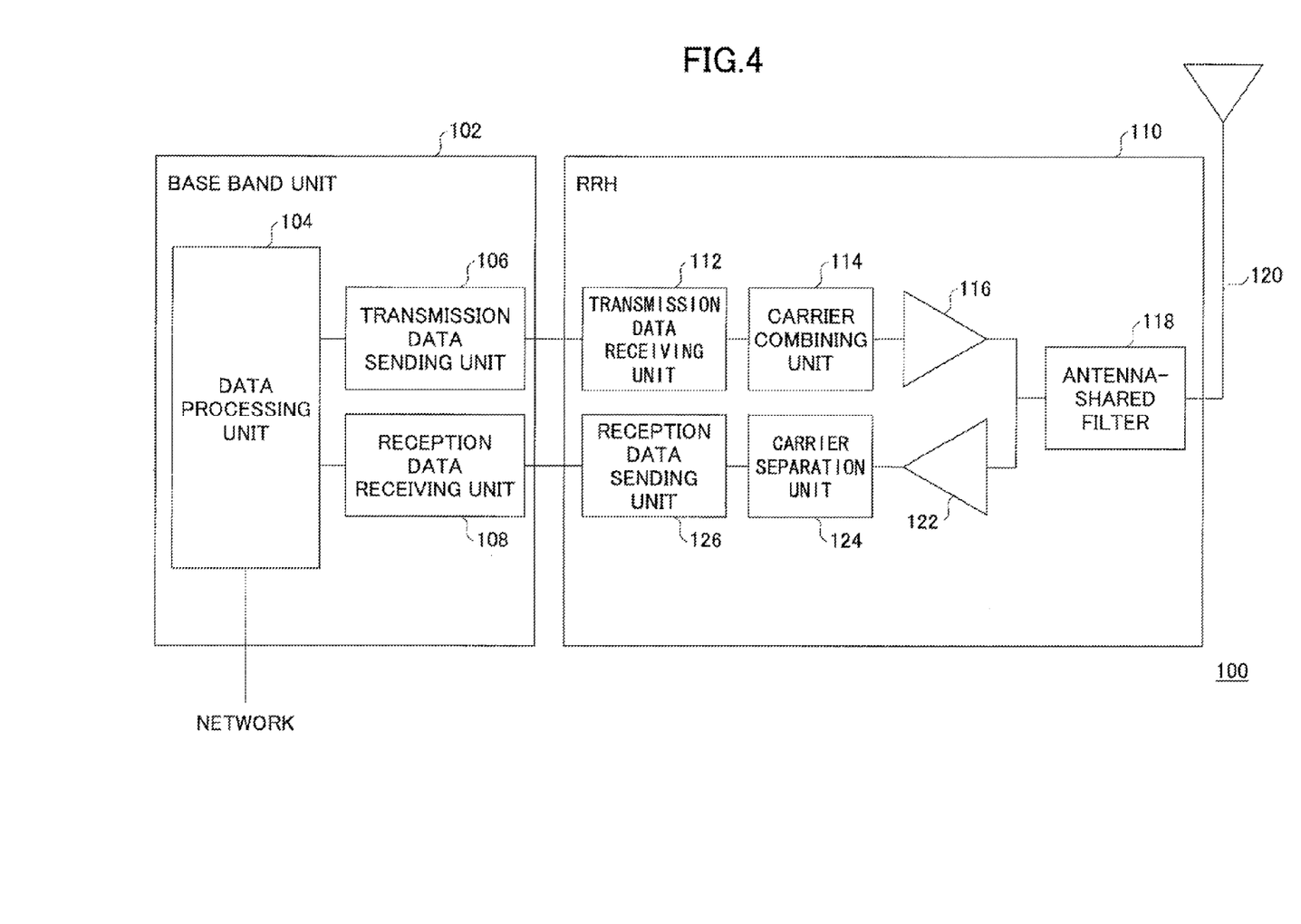
FIG. 4 illustrates a base station according to an embodiment.

FIG. 4 illustrates a base station 100 according to an embodiment. FIG. 4 primarily illustrates a hardware configuration of the base station 100.

The base station 100 includes a base band unit (BBU) 102 and a remote radio head (RRH) 110. FIG. 4 illustrates one remote radio head 110, but there may be two or more remote radio heads 110.

The base band unit 102 performs base band signal processing. The base band unit 102 includes a data processing unit 104 that processes data exchanged with a network. The data processing unit 104 may be implemented by a DSP (Digital Signal Processor). Furthermore, the data processing unit 104 may be implemented by a FPGA (Field Programmable Gate Array). Furthermore, the data processing unit 104 may be implemented by a dedicated LSI (Large Scale Integration).

The base band unit 102 includes a transmission data sending unit 106. The transmission data sending unit 106 is connected to the data processing unit 104 and the RRH 110. The transmission data sending unit 106 sends data from the data processing unit 104 to the RRH 110. The transmission data sending unit 106 may be implemented by an E/O converter (Electrical/Optical Converter). In this case, electric signals from the data processing unit 104 are converted into optical signals by the E/O converter. The electric signals from the data processing unit 104 converted into optical signals are input to the RRH 110 via optical fiber. The transmission data sending unit 106 may be implemented by a parallel-serial converter. In this case, parallel signals from the data processing unit 104 are converted into serial signals by the parallel-serial converter. The parallel signals from the data processing unit 104 that have been converted into serial signals are input to the RRH 110 via a dial signal transmission path.

The base band unit 102 includes a reception data receiving unit 108. The reception data receiving unit 108 is connected to the data processing unit 104 and the RRH 110. The reception data receiving unit 108 inputs data from the RRH 110 to the data processing unit 104. The reception data receiving unit 108 may be implemented by an O/E converter (Optical/Electrical Converter). In this case, optical signals from the RRH 110 are converted into electric signals by the O/E converter. The optical signals from the RRH 110 are input to the base band unit 102 via optical fiber. The O/E converter inputs the optical signals from the RRH 110 converted into electric signals to the data processing unit 104. The reception data receiving unit 108 may be implemented by a serial-parallel converter. In this case, the serial signals from the RRH 110 are converted into parallel signals by the serial-parallel converter. The serial signals are input from the RRH 110 to the base band unit 102 via a digital signal transmission path. The serial-parallel converter inputs the serial signals from the RRH 110 that have been converted into parallel signals to the data processing unit 104.

The RRH 110 is a wireless unit of a base station. The RRH 110 includes a transmission data receiving unit 112. The transmission data receiving unit 112 is connected to the transmission data sending unit 106. The transmission data receiving unit 112 inputs data from the base band unit 102 to a carrier combining unit 114. The transmission data receiving unit 112 may be implemented by an O/E converter. In this case, optical signals from the base band unit 102 are converted into electric signals by the O/E converter. The optical signals are input from the base band unit 102 to the transmission data receiving unit 112 via optical fiber. The O/E converter inputs the optical signals from the base band unit 102 converted into electric signals, to the carrier combining unit 114. The transmission data receiving unit 112 may be implemented by a serial-parallel converter. In this case, the serial signals from the base band unit 102 are converted into parallel signals by the serial-parallel converter. The serial signals from the base band unit 102 are input to the RRH 110 via a digital signal transmission path. The serial-parallel converter inputs the serial signals from the base band unit 102 that have been converted into parallel signals, to the carrier combining unit 114.

The RRH 110 includes the carrier combining unit 114. The carrier combining unit 114 is connected to the transmission data receiving unit 112. The carrier combining unit 114 combines the data from the transmission data receiving unit 112 with carrier signals. The carrier combining unit 114 inputs the signals combined with the carrier signals, to a transmitter 116. The carrier combining unit 114 may be implemented by an FPGA. Furthermore, the carrier combining unit 114 may be implemented by a dedicated LSI.

The RRH 110 includes the transmitter 116. The transmitter 116 is connected to the carrier combining unit 114. The transmitter 116 amplifies signals from the carrier combining unit 114. The transmitter 116 inputs the amplified signals from the carrier combining unit 114, to an antenna-shared filter 118. The signals from the transmitter 116 are subjected to band limitation by the antenna-shared filter 118, and are sent from an antenna 120.

The RRH 110 includes the antenna-shared filter 118. The antenna-shared filter 118 is connected to the transmitter 116. The antenna-shared filter 118 performs band limitation on the signals from the transmitter 116. The antenna-shared filter 118 transmits the signals from the transmitter 116 that have been subjected to band limitation, from an antenna 120. The antenna-shared filter 118 performs band limitation on the signals from the antenna 120. The antenna-shared filter 118 inputs the signals from the antenna 120 that have been subjected to band limitation, to a receiver 122.

The RRH 110 includes the antenna 120. The antenna 120 is connected to the antenna-shared filter 118. The antenna 120 transmits signals from the antenna-shared filter 118. The antenna 120 receives wireless signals. The wireless signals are input to the antenna-shared filter 118.

The RRH 110 includes a receiver 122. The receiver 122 is connected to the antenna-shared filter 118. The receiver 122 receives signals from the antenna-shared filter 118. The receiver 122 inputs the received signals to a carrier separation unit 124.

The RRH 110 includes the carrier separation unit 124. The carrier separation unit 124 is connected to the receiver 122. The carrier separation unit 124 separates the carrier signals from the signals received from the receiver 122. The carrier separation unit 124 may be implemented by FPGA. Furthermore, the carrier separation unit 124 may be implemented by a dedicated LSI.

The RRH 110 includes a reception data sending unit 126. The reception data sending unit 126 is connected to the carrier separation unit 124.

The reception data sending unit 126 sends signals from which carrier signals have been separated by the carrier separation unit 124, to the base band unit 102. The reception data sending unit 126 may be implemented by an E/O converter. In this case, the electric signals from the carrier separation unit 124 are converted into optical signals by the E/O converter. The electric signals from the carrier separation unit 124 that have been converted into optical signals are input to the base band unit 102 via optical fiber. Furthermore, the reception data sending unit 126 may be implemented by a parallel-serial converter. In this case, the parallel signals from the carrier separation unit 124 are converted into serial signals by the parallel-serial converter. The parallel signals from the carrier separation unit 124 that have been converted into serial signals are input to the base band unit 102 via a digital signal transmission line.

Transmitter 116

FIGS. 5A through 6C illustrate a process executed by the transmitter 116.

The transmitter 116 is connected to the carrier combining unit 114. The transmitter 116 includes an amplifier for amplifying signals from the carrier combining unit 114. In the following, a description is given of mainly an amplifier of the transmitter 116.

In the transmitter 116, signals from the carrier combining unit 114 are input. The transmitter 116 creates signals orthogonal to signals from the carrier combining unit 114, based on signals from the carrier combining unit 114.

Specifically, signals from the carrier combining unit 114 are expressed by formula (1).

$$x(t)\exp(j\theta(t)) \quad (1)$$

In formula (1), "x(t)" is an amplitude component in which the size is standardized to 1, "exp" is the base of a natural logarithm, "j" is an imaginary unit, and "e(t)" is a phase component.

In the following, signals input from the carrier combining unit 114 to the transmitter 116 are referred to as "original input signal components". Original input signal components are expressed by the bottom diagram in FIG. 5B and FIG. 6A. FIGS. 6A through 6C illustrate spectrums of modulation wave signals as examples of original input signal components. Signals orthogonal to original input signal components are referred to as "supplementary signal components". Supplementary signal components are expressed by the top diagram in FIG. 5B and FIG. 6B.

Supplementary signal components are expressed by formula (2).

$$\pm k\sqrt{1-|x(t)|^2}\exp(j\theta(t)) \quad (2)$$

In formula (2), "k" is a supplementary signal coefficient, and may be values of 1, −1, j, and −j.

Formula (2) is obtained by performing amplitude phase conversion on the original input signal components.

A description is given on an amplitude phase conversion process.

Figure 5A:
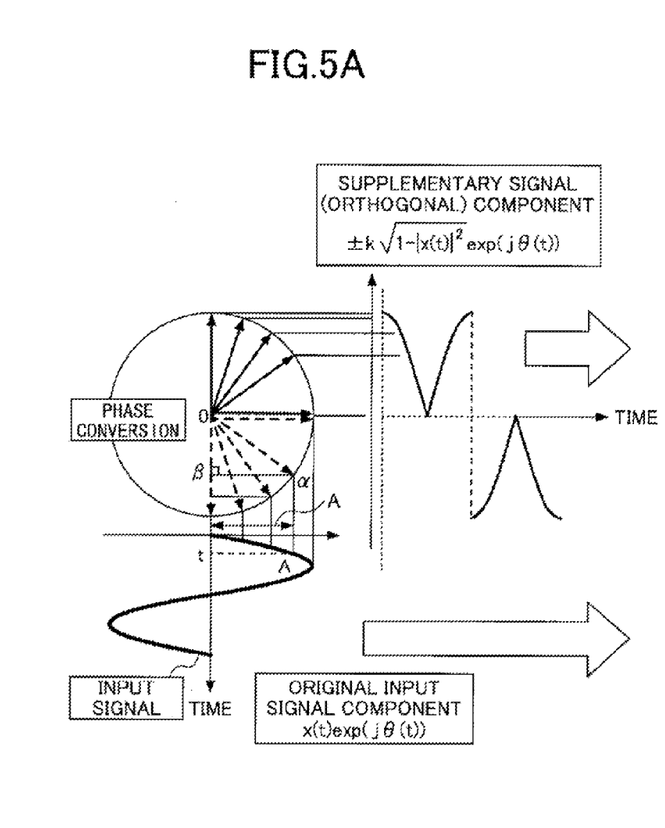
FIGS. 5A through 5C illustrate a process executed by a transmitter.

FIG. 5A illustrates a circle having a radius 1 having a center "0" along a line extended from a temporal axis of an input signal. The respective points on a sine wave may be expressed as a vector rotating on the circle.

For example, in formula (1), at a time t, the original input signal component can be obtained from x(t)exp(je(t)). In FIG. 5A, x(t) is indicated by "A" on the sine wave, and is indicated by "α" on the circle. The intersection of a perpendicular line dropped to the temporal axis from "α" on the circle and the temporal axis is "β".

In this case, a triangle Iαβ, which is a right triangle, is considered. The length of Oα is 1 and the length of αβ is A. Thus, according to the Pythagorean theorem, the length of Oβ orthogonal to αβ is expressed by $\sqrt{(1-A^2)}$. By including a phase component in $\sqrt{(1-A^2)}$, the supplementary signal component expressed by formula (2) is obtained.

The transmitter 116 performs D/A conversion on the supplementary signal component. Furthermore, the transmitter 116 performs D/A conversion on the original input signal component.

The transmitter 116 uses the supplementary signal component converted into an analog signal and the original input signal component converted into an analog signal to generate a constant envelope signal.

Specifically, the transmitter 116 generates a signal having a phase difference of 180 degrees with respect to the supplementary signal component converted to an analog signal. 180 degrees is one example. The transmitter 116 combines the supplementary signal component with no phase difference converted into an analog signal, with an original input signal component converted into an analog signal, and generates a combined signal (hereinafter, "first combined signal"). The transmitter 116 combines a signal with a phase difference of 180 degrees with respect to the supplementary signal component converted into an analog signal, with an original input signal component converted into an analog signal, and generates a combined signal (hereinafter, "second combined signal").

The transmitter 116 amplifies the first combined signal and the second combined signal. The transmitter 116 combines the first combined signal that has been amplified and the second combined signal that has been amplified. The signal obtained by combining (adding) the first combined signal that has been amplified and the second combined signal that has been amplified, is expressed by FIG. 6C.

Figures 5B, 5C:
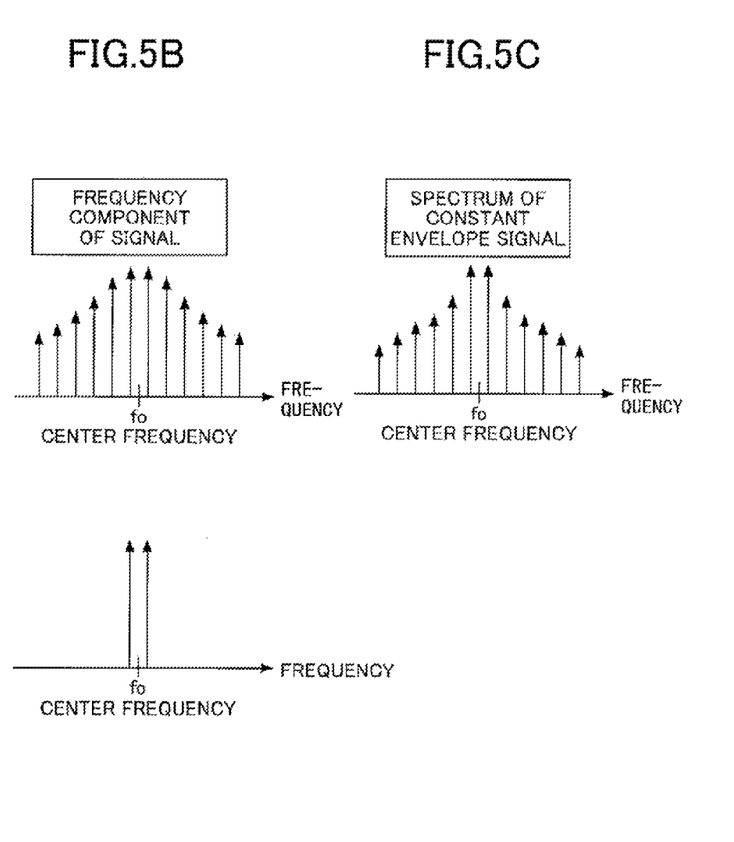
Figure 6A:
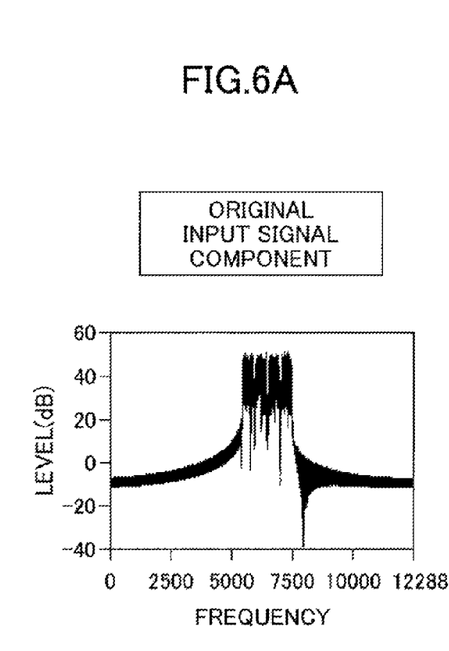
FIGS. 6A through 6C illustrate a process executed by a transmitter.
Figure 6B:
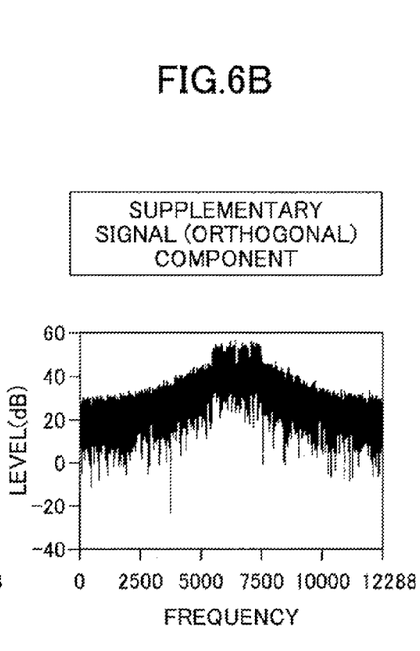
Figure 6C:
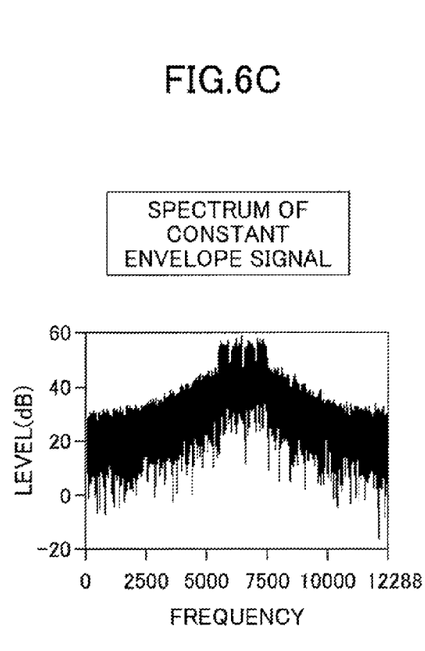

As illustrated in the bottom diagram of FIG. 5B, in the transmitter 116 according to one embodiment, the frequency band of the original input signal component does not become wide. The frequency band of the original input signal component does not become wide. Therefore, the part corresponding to the original input signal component of the transmitter 116 does not need to have a function of performing a D/A conversion process on wide band signals. That is to say, the D/A converter may have a low sampling rate. Furthermore, the D/A converter does not need to have a function of performing a D/A conversion process on wide band signals, and thus does not need to have high processing speed.

Meanwhile, the frequency band of supplementary signal components becomes wide. The frequency band of supplementary signal components becomes wide, but the supplementary signal components are converted into constant envelope signals before being amplified. Constant envelope signals operate at a saturation level of an amplifier, and therefore the D/A conversion process does not need to be performed with precision. That is to say, a D/A converter of low resolution performance will suffice. The processing speed of D/A conversion needs to be high, but the precision does not need to be high.

As described above, in the transmitter 116 according to one embodiment, the amplifier does not need to perform a D/A conversion process at high speed and high precision. That is to say, the amplifier of the transmitter 116 is configured without using a D/A converter having a high sampling rate and high resolution performance.

Figure 7:
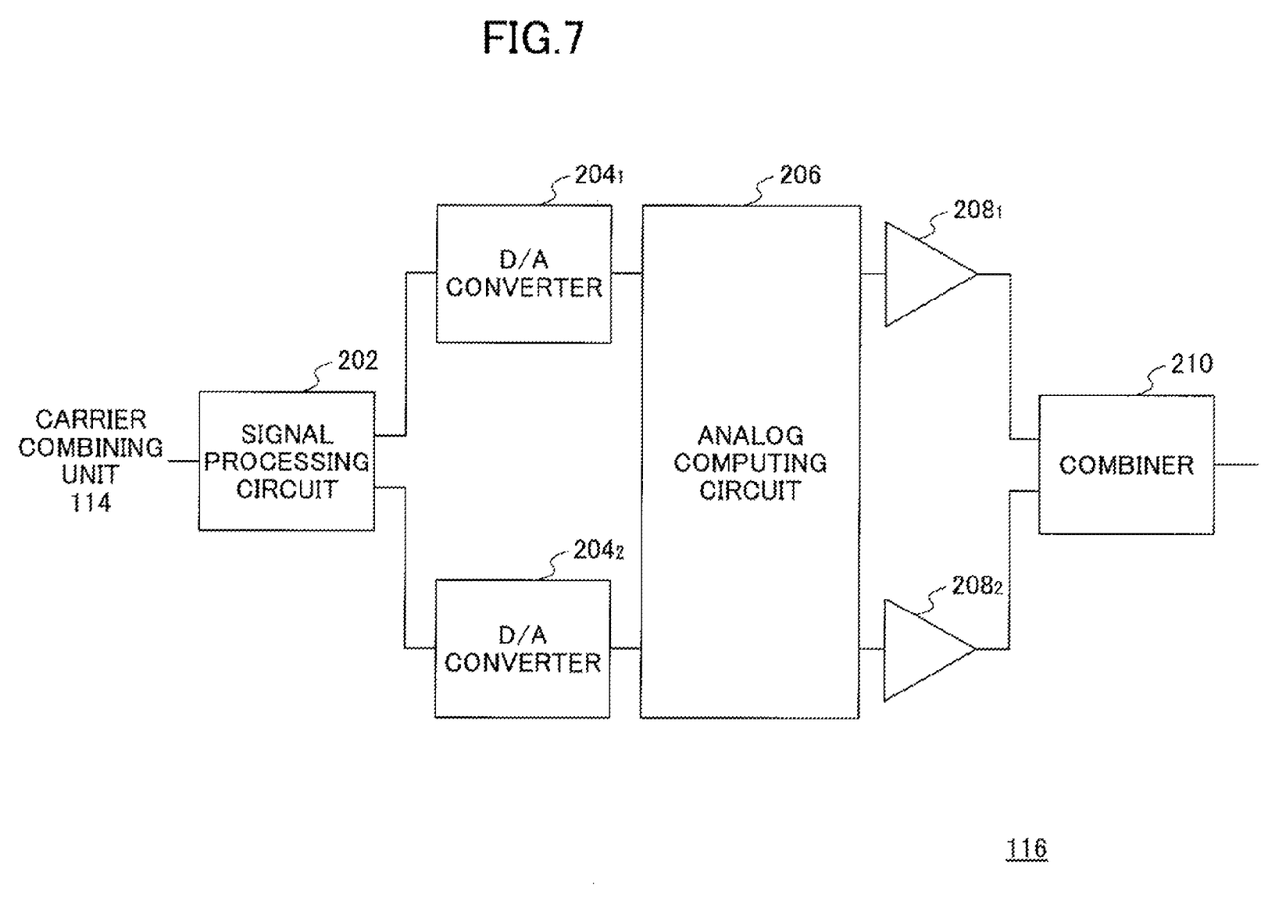
FIG. 7 illustrates the transmitter according to one embodiment.

FIG. 7 illustrates the transmitter 116 according to one embodiment. FIG. 7 primarily illustrates a hardware configuration of an amplifier included in the transmitter 116.

The transmitter 116 includes a signal processing circuit 202. The signal processing circuit 202 is connected with the carrier combining unit 114. The signal processing circuit 202 creates signals of a supplementary signal component based on signals from the carrier combining unit 114, using signals from the carrier combining unit 114 as original input signal components.

Specifically, signals from the carrier combining unit 114 are expressed by formula (1).

The supplementary signal components are expressed by formula (2).

The signal processing circuit 202 inputs supplementary signal components in a D/A converter $204_1$, and inputs original input signal components in a D/A converter $204_2$. The functions of the carrier combining unit 114 and the functions of the signal processing circuit 202 may be implemented by an LSI or a FPGA.

The transmitter 116 includes the D/A converter $204_1$. The D/A converter $204_1$ is connected to the signal processing circuit 202. The D/A converter $204_1$ converts supplementary signal components from the signal processing circuit 202 into analog signals. The D/A converter $204_1$ inputs supplementary signal components that have been converted into analog signals to an analog computing circuit 206.

The transmitter 116 includes the D/A converter $204_2$. The D/A converter $204_2$ is connected to the signal processing circuit 202. The D/A converter $204_2$ converts the original input signal components from the signal processing circuit 202 into analog signals. The D/A converter $204_2$ inputs the original input signal components that have been converted into analog signals, to the analog computing circuit 206.

The transmitter 116 includes the analog computing circuit 206. The analog computing circuit 206 is connected to the D/A converters $204_1$ and $204_2$. The analog computing circuit 206 uses the analog signals from the D/A converter $204_1$ and the analog signals from the D/A converter $204_2$ to generate constant envelope signals. Specifically, the analog computing circuit 206 generates a signal having a phase difference of 180 degrees with respect to the analog signal from the D/A converter $204_1$. The analog computing circuit 206 combines the analog signal with no phase difference from the D/A converter $204_1$ with the analog signal from the D/A converter $204_2$, and generates a first combined signal. The analog computing circuit 206 combines a signal with a phase difference of 180 degrees with respect to the analog signal from the D/A converter $204_1$ with an analog signal from the D/A converter $204_2$, and generates a second combined signal. The analog computing circuit 206 inputs the first combined signal to an amplifier $208_1$. The analog computing circuit 206 inputs the second combined signal to an amplifier $208_2$.

The transmitter 116 includes the amplifier $208_1$. The amplifier $208_1$ is connected to the analog computing circuit 206. The amplifier $208_1$ amplifies the first combined signal from the analog computing circuit 206. The amplifier $208_1$ inputs the amplified first combined signal to a combiner 210.

The amplifier $208_1$ may be implemented by an input matching circuit (not illustrated) to which output signals from the analog computing circuit 206 are input, an amplifying element (not illustrated) to which output signals from the input matching circuit are input, and an output matching circuit (not illustrated) to which output signals from the amplifying element are input. The output signals from the output matching circuit are input to the combiner 210. The amplifying element may be implemented by, for example, a transistor.

The transmitter 116 includes the amplifier $208_2$. The amplifier $208_2$ is connected to the analog computing circuit 206. The amplifier $208_2$ amplifies the second combined signals from the analog computing circuit 206. The amplifier $208_2$ inputs the amplified second combined signals to the combiner 210. The amplifier $208_2$ may be implemented by an input matching circuit (not illustrated) to which output signals from the analog computing circuit 206 are input, an amplifying element (not illustrated) to which output signals from the input matching circuit are input, and an output matching circuit (not illustrated) to which output signals from the amplifying element are input. The output signals from the output matching circuit are input to the combiner 210. The amplifying element may be implemented by, for example, a transistor.

The transmitter 116 includes the combiner 210. The combiner 210 is connected to the amplifiers $208_1$ and $208_2$. The combiner 210 combines the amplified first combined signal from the amplifier $208_1$ and the amplified second combined signal from the amplifier $208_2$. The combiner 210 outputs a signal created by combining the amplified first combined signal from the amplifier $208_1$ and the amplified second combined signal from the amplifier $208_2$. At the combiner 210, an output signal from the amplifier $208_1$ transmitted along a transmission path (not illustrated) and an output signal from the amplifier $208_2$ transmitted along a transmission path (not illustrated) are added together.

Analog Computing Circuit 206

Figure 8:
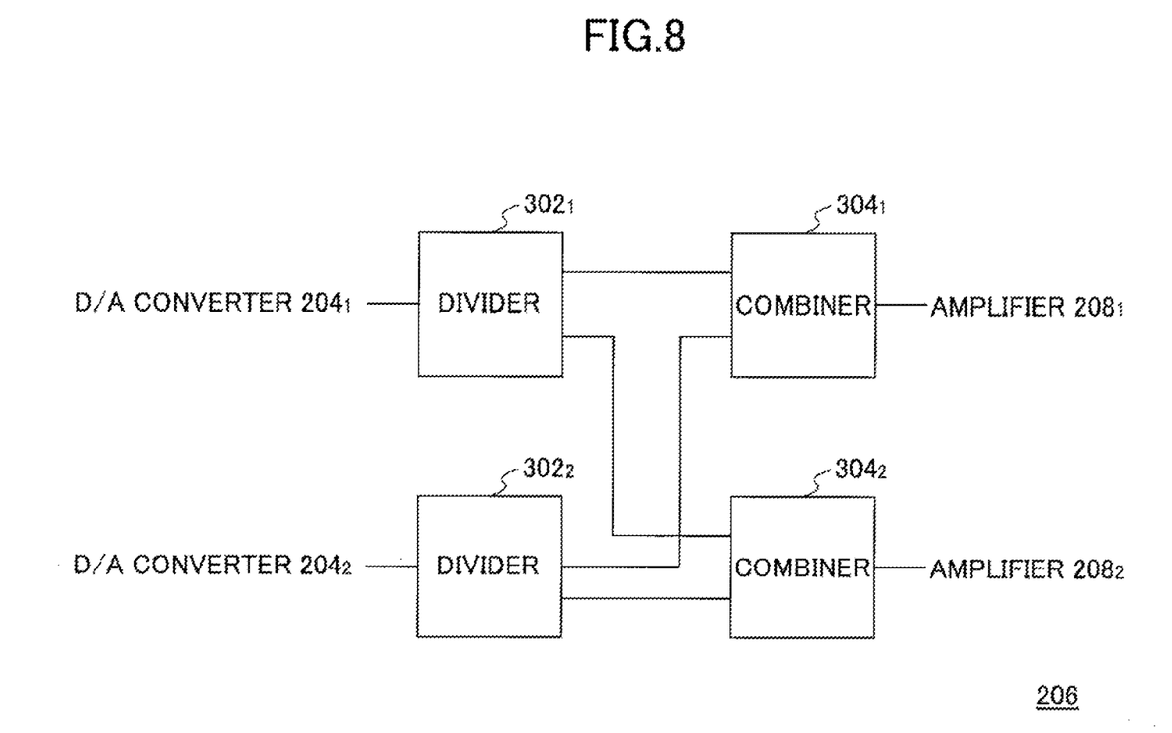
FIG. 8 illustrates the analog computing circuit according to one embodiment (part 1)

FIG. 8 illustrates the analog computing circuit 206 according to one embodiment (part 1).

The analog computing circuit 206 according to one embodiment (part 1) includes a 180 degrees divider, an in-phase divider, and two 90 degrees combiners.

The analog computing circuit 206 includes a divider $302_1$. The divider $302_1$ is connected to the D/A converter $204_1$. The D/A converter $204_1$ outputs signals when k=1 in formula (2). The divider $302_1$ generates a signal with no phase difference with respect to the analog signal from the D/A converter $204_1$ and a signal having a phase difference of 180 degrees with respect to the analog signal from the D/A converter $204_1$. That is to say, the divider $302_1$ is implemented by the 180 degrees divider, and outputs signals having a phase that is 180 degrees delayed with respect to the analog signals from the D/A converter $204_1$. The divider $302_1$ may be implemented by a hybrid circuit of 180 degrees. The divider $302_1$ inputs analog signals with no phase difference from the D/A converter $204_1$, to a combiner $304_1$. The divider $302_1$ inputs signals having a phase difference of 180 degrees with respect to the analog signal from the D/A converter $204_1$, to a combiner $304_2$.

The analog computing circuit 206 includes a divider 302₂. The divider 302₂ is connected to the D/A converter 204₂. The divider 302₂ is implemented by an in-phase divider, and inputs analog signals from the D/A converter 204₂ to the combiners 304₁ and 304₂.

The analog computing circuit 206 includes the combiner 304₁. The combiner 304₁ is connected to the dividers 302₁ and 302₂. The combiner 304₁ may be implemented by a hybrid circuit of 90 degrees. The combiner 304₁ combines an analog signal from the divider 302₁ with an analog signal from the divider 302₂ by applying a phase difference of 90 degrees between the signals, and generates a first combined signal. The combiner 304₁ inputs the first combined signal in the amplifier 208₁.

The analog computing circuit 206 includes the combiner 304₂. The combiner 304₂ is connected to the divider 302₁ and the divider 302₂. The combiner 304₂ may be implemented by a hybrid circuit of 90 degrees. The combiner 304₂ combines an analog signal from the divider 302₁ and an analog signal from the divider 302₂ by applying a phase difference of 90 degrees between the signals, and generates a second combined signal. The combiner 304₂ inputs the second combined signal in the amplifier 208₂.

Figure 9:
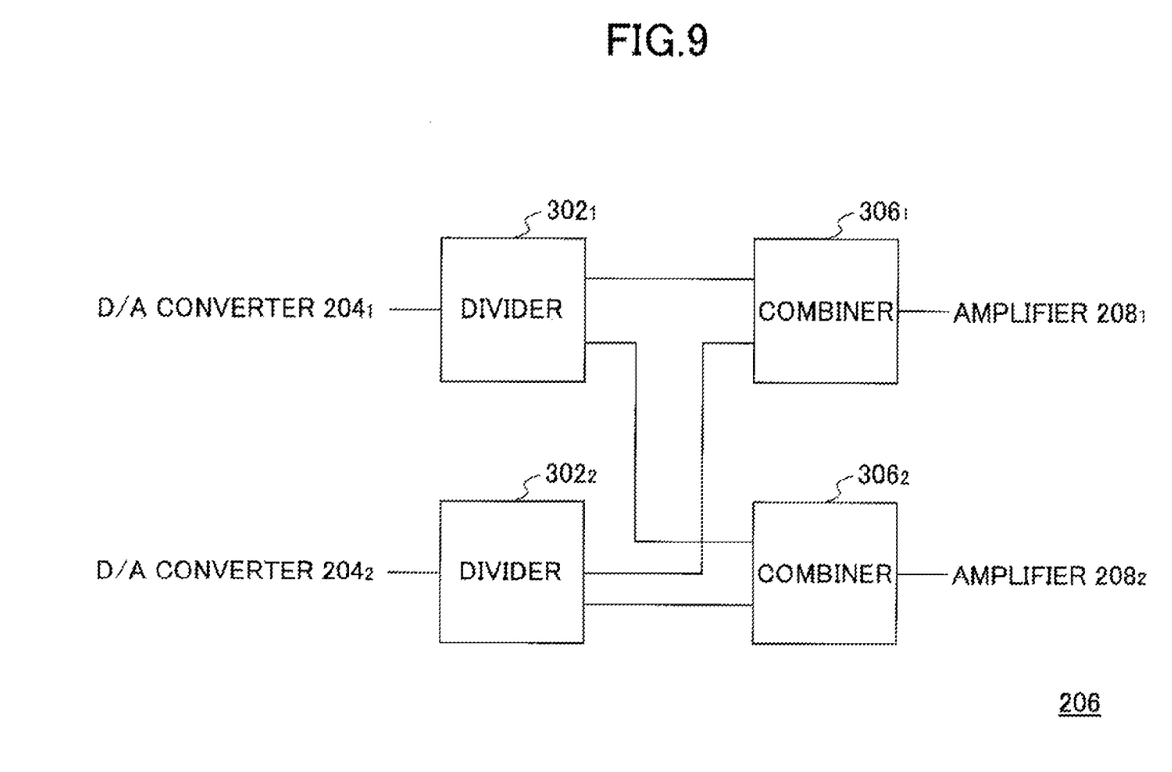
FIG. 9 illustrates the analog computing circuit according to one embodiment (part 2)

FIG. 9 illustrates the analog computing circuit 206 according to one embodiment (part 2).

The analog computing circuit 206 according to one embodiment (part 2) includes a 180 degrees divider, an in-phase divider, and two in-phase combiners.

The analog computing circuit 206 includes a divider 302₁. The divider 302₁ is connected to the D/A converter 204₁. The D/A converter 204₁ outputs signals when k=1 in formula (2). The divider 302₁ generates a signal with no phase difference with respect to the analog signal from the D/A converter 204₁ and a signal having a phase difference of 180 degrees with respect to the analog signal from the D/A converter 204₁. That is to say, the divider 302₁ is implemented by the 180 degrees divider, and outputs signals having a phase that is 180 degrees delayed with respect to the analog signals from the D/A converter 204₁. The divider 302₁ may be implemented by a hybrid circuit of 180 degrees. The divider 302₁ inputs analog signals with no phase difference from the D/A converter 204₁, to a combiner 306₁. The divider 302₁ inputs signals having a phase difference of 180 degrees with respect to the analog signal from the D/A converter 204₁, to a combiner 306₂.

The analog computing circuit 206 includes a divider 302₂. The divider 302₂ is connected to the D/A converter 204₂. The divider 302₂ is implemented by an in-phase divider, and inputs analog signals from the D/A converter 204₂ to the combiners 306₁ and 306₂.

The analog computing circuit 206 includes the combiner 306₁. The combiner 306₁ is connected to the dividers 302₁ and 302₂. The combiner 306₁ may be implemented by an in-phase combiner, and in-phase combines an analog signal from the divider 302₁ with an analog signal from the divider 302₂, and generates a first combined signal. The combiner 306₁ inputs the first combined signal in the amplifier 208₁.

The analog computing circuit 206 includes the combiner 306₂. The combiner 306₂ is connected to the dividers 302₁ and 302₂. The combiner 306₂ may be implemented by an in-phase combiner, and in-phase combines an analog signal from the divider 302₁ with an analog signal from the divider 302₂, and generates a second combined signal. The combiner 306₂ inputs the second combined signal in the amplifier 208₂.

Operation of Transmitter 116

Figure 10:
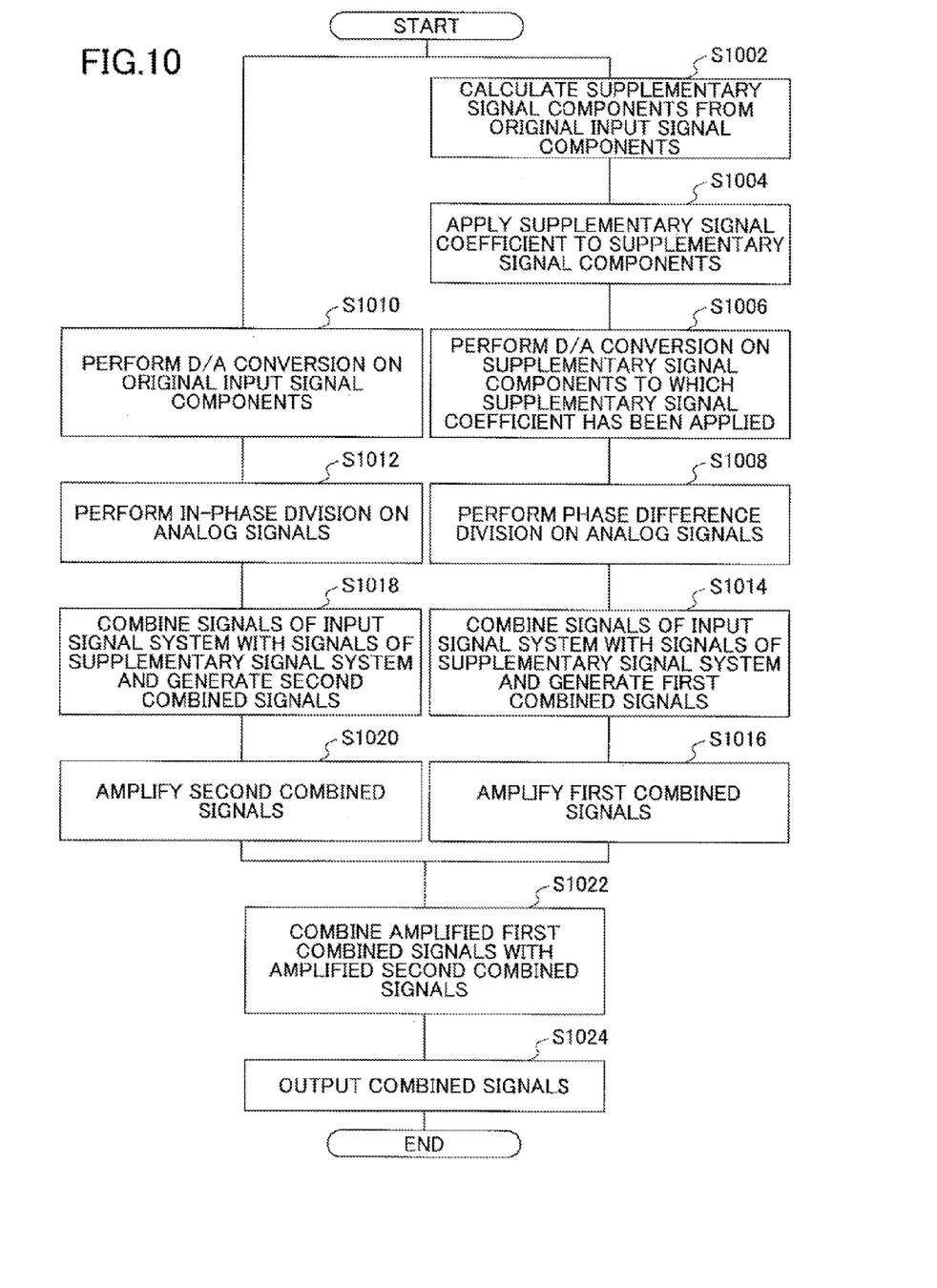
FIG. 10 illustrates a flowchart of an operation of the transmitter according to one embodiment.

FIG. 10 illustrates an operation of the transmitter 116 according to one embodiment. The operation of an amplifier included in the transmitter 116 is primarily described.

At step S1002, the signal processing circuit 202 calculates supplementary signal components from original input signal components.

At step S1004, the signal processing circuit 202 applies a supplementary signal coefficient to the supplementary signal components. That is to say, the signal processing circuit 202 multiplies the supplementary signal components by the supplementary signal coefficient. The supplementary signal coefficient may be set in advance.

At step S1006, the D/A converter 204₁ performs D/A conversion on the supplementary signal components to which the supplementary signal coefficient has been applied.

At step S1008, the analog computing circuit 206 performs phase difference division on the analog signals obtained by performing the D/A conversion at step S1006. The phase difference may be a value dependent on the supplementary signal coefficient. For example, the analog computing circuit 206 applies a phase difference of 180 degrees in performing the division.

At step S1010, the D/A converter 204₂ performs D/A conversion on the original input signal components.

At step S1012, the analog computing circuit 206 performs in-phase division on the analog signals obtained by performing D/A conversion on the original input signal components at step S1010.

At step S1014, the analog computing circuit 206 combines the signals of the input signal system obtained by performing in-phase division at step S1012 with the signals of the supplementary signal system obtained by performing in-phase division at step S1008, and generates first combined signals.

At step S1016, the amplifier 208₁ amplifies the first combined signals.

At step S1018, the analog computing circuit 206 combines the signals of the input signal system obtained by performing in-phase division at step S1012 with the signals of the supplementary signal system obtained by performing in-phase division at step S1008, and generates second combined signals.

At step S1020, the amplifier 208₂ amplifies the second combined signals.

At step S1022, the combiner 210 combines the first combined signals amplified at step S1016 with the second combined signals amplified at step S1020.

At step S1024, the combiner 210 outputs the signals obtained by combining the amplified first combined signals and the amplified second combined signals.

Modification

Figure 11:
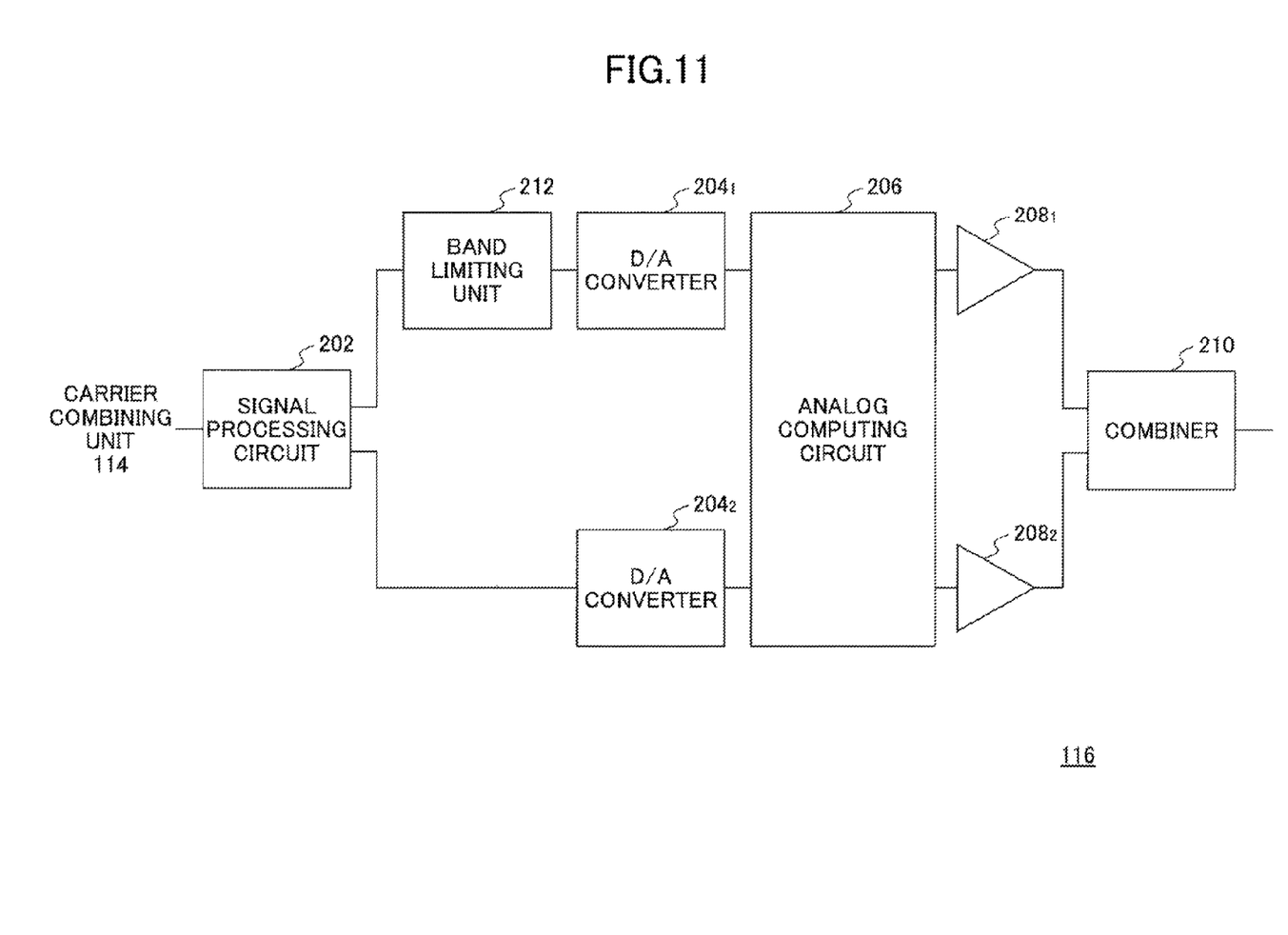
FIG. 11 illustrates a modification of the transmitter.

FIG. 11 illustrates a modification of the transmitter 116. The transmitter 116 includes an amplifier for amplifying signals from the carrier combining unit 114. In the following, an amplifier included in the transmitter 116 is primarily described.

The transmitter 116 according to an embodiment is different from the transmitter illustrated in FIG. 7 in that a band limiting unit 212 is included. The band limiting unit 212 is connected to the signal processing circuit 202 and the D/A converter 204₁. The band limiting unit 212 limits the frequency band of the supplementary signal components from the signal processing circuit 202. Specifically, the band limiting unit 212 may be implemented by a low pass filter (LPF).

The supplementary signal components input to the D/A converter 204₁ are not in an unlimited band. That is to say, the frequency band of the supplementary signal components becomes wide, but the bandwidth is limited. The band limiting unit 212 causes the supplementary signal components to pass a low frequency band. By including the band limiting unit 212, the frequency band of the supplementary signal components input to the D/A converter 204₁ is made narrow, and therefore the D/A conversion processing speed of the D/A converter $204_1$ may be low. That is to say, the D/A converter $204_1$ may be implemented with a D/A converter having a low sampling rate.

By including the band limiting unit 212, the supplementary signal components input to the amplifier $208_1$ and the supplementary signal components input to the amplifier $208_2$ may deviate from the constant envelope signals. However, the amplifiers $208_1$ and $208_2$ are performing saturation operation, so the performance does not decline significantly.

Distortion Compensation Circuit

Figure 12:
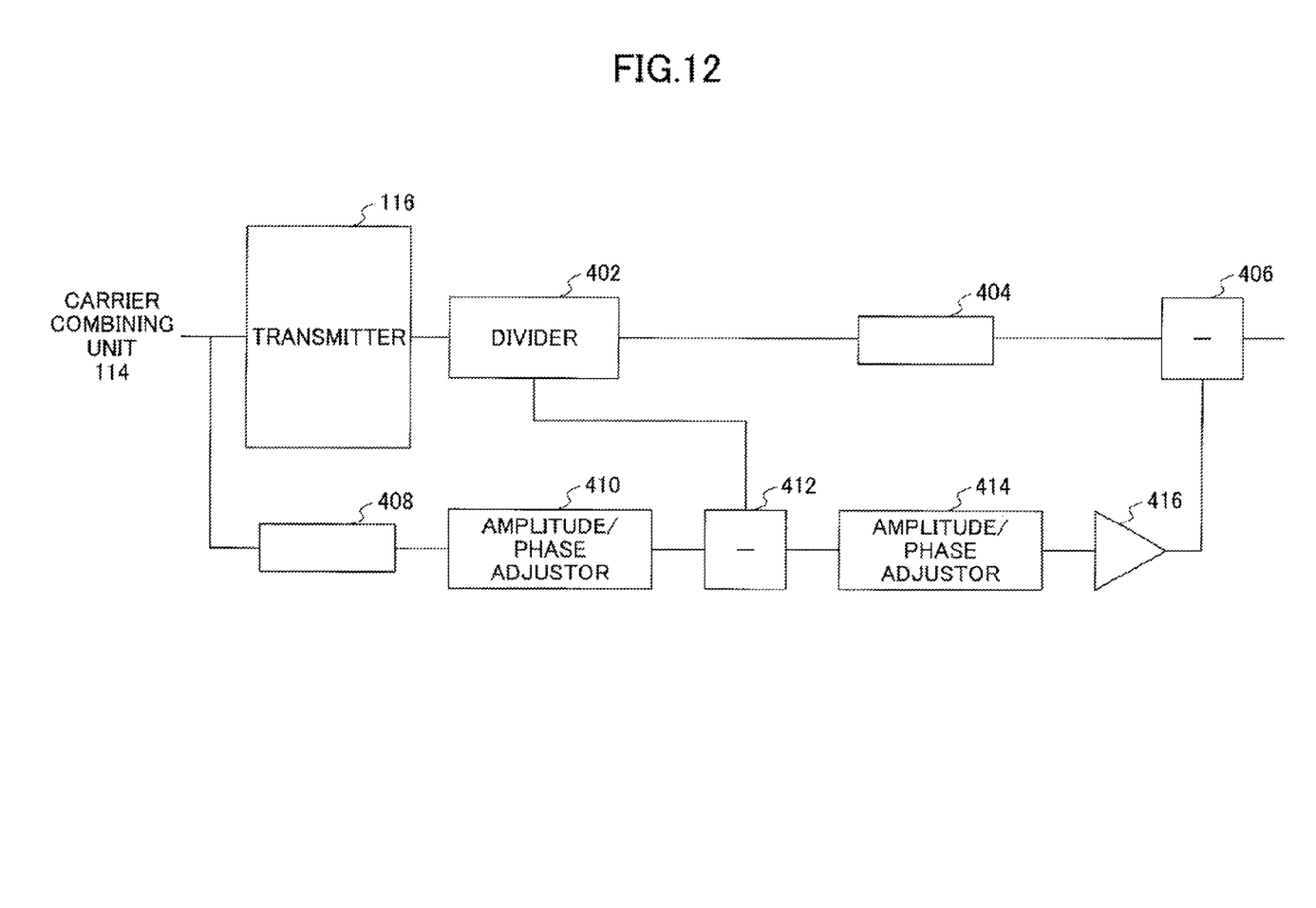
FIG. 12 illustrates a distortion compensation circuit according to one embodiment.

FIG. 12 illustrates a distortion compensation circuit according to one embodiment, implemented by using the transmitter 116 according to the modification.

The distortion compensation circuit includes a divider 402. The divider 402 is connected to the transmitter 116. The divider 402 divides output signals from the transmitter 116. The divider 402 inputs the divided signals to a subtractor 406 via a delay line 404. The divider 402 inputs the divided signals in a subtractor 412.

Meanwhile, the output signals from the carrier combining unit 114 are input to an amplitude/phase adjustor 410 via a delay line 408.

The amplitude/phase adjustor 410 is connected to the carrier combining unit 114 via the delay line 408. The amplitude/phase adjustor 410 adjusts the deviation of the amplitude and phase of the output signals from the carrier combining unit 114. The amplitude/phase adjustor 410 inputs the signals whose deviation of the amplitude and phase has been adjusted, to the subtractor 412.

The subtractor 412 is connected to the divider 402 and the amplitude/phase adjustor 410.

The subtractor 412 detects error signals by obtaining the difference between the output signals from the divider 402 and the output signals from the amplitude/phase adjustor 410. The error signals from the subtractor 412 are input to an amplitude/phase adjustor 414.

The amplitude/phase adjustor 414 is connected to the subtractor 412. The amplitude/phase adjustor 414 adjusts the deviation of the amplitude and phase of the error signals from the subtractor 412. The amplitude/phase adjustor 414 inputs the error signals whose deviation of the amplitude and phase has been adjusted, to an amplifier 416.

The amplifier 416 is connected to the amplitude/phase adjustor 414. The amplifier 416 amplifies the error signals from the amplitude/phase adjustor 414. The amplitude/phase adjustor 414 inputs the amplified error signals to the subtractor 406.

The subtractor 406 is connected to the divider 402 and the amplifier 416. The subtractor 406 removes error components from the signals from the transmitter 116, by obtaining the difference between the output signals from the divider 402 and the error signals from the amplifier 416. Accordingly, distortion compensation is performed. The subtractor 406 outputs signals that have been subjected to distortion compensation.

With the distortion compensation circuit according to one embodiment, it is possible to detect errors by using original input signal components. Therefore, distortion compensation is performed without providing a circuit for generating original input signal components.

According to an embodiment of the present invention, it is possible to efficiently perform a process of generating constant envelope signals.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifier comprising:
a signal processing circuit configured to generate an orthogonal signal orthogonal to an input signal;
a first D/A converter configured to convert the orthogonal signal into a first analog signal;
a second D/A converter configured to convert the input signal into a second analog signal; and
an analog computing circuit configured to generate a constant envelope signal based on the first analog signal from the first D/A converter and the second analog signal from the second D/A converter, and including
a first divider configured to divide a first output signal from the first D/A converter into the first output signal and a second output signal having a phase difference with respect to the first output signal,
a second divider configured to divide a third output signal from the second D/A converter into the third output signal and a fourth output signal having a same phase as the third output signal,
a first combiner configured to combine the first output signal from the first divider with the third output signal from the second divider, and
a second combiner configured to combine the second output signal from the first divider with the fourth output signal from the second divider.

2. The amplifier according to claim 1, wherein
the second D/A converter has a resolution performance that is higher than a resolution performance of the first D/A converter, and
the first D/A converter has a sampling rate that is higher than a sampling rate of the second D/A converter.

3. The amplifier according to claim 1, further comprising:
a band limiting filter configured to limit a band of the orthogonal signal wherein
the first D/A converter is configured to convert the orthogonal signal whose band has been limited by the band limiting filter, into the first analog signal.

4. The amplifier according to claim 3, wherein
the second D/A, converter has a resolution performance that is higher than a solution performance of the first D/A converter.

5. The amplifier according to claim 1, wherein
the signal processing circuit is configured to generate the orthogonal signal expressed by $$\pm k\sqrt{1-|x(t)|^2}\exp(j\theta(t))$$

(k being a coefficient expressed by 1, −1, j, −j)
in a case where the input signal is expressed by $x(t)\exp(j\theta(t))$
("x(t)" being an amplitude component in which a size is standardized to 1, "exp" being a base of a natural logarithm, "j" being an imaginary unit, and "θ(t)" being a phase component).

6. An amplifier comprising:
a signal processing circuit configured to generate an orthogonal signal orthogonal to an input signal;

a first D/A converter configured to convert the orthogonal signal into a first analog signal;

a second D/A converter configured to convert the input signal into a second analog signal; and an analog computing circuit configured to generate a constant envelope signal based on the first analog signal from the first D/A converter and the second analog signal from the second D/A converter, and including a first divider configured to divide a first output signal from the first D/A converter into the first output signal and a second output signal having a phase difference with respect to the first output signal, a second divider configured to divide a third output signal from the second D/A converter into the third output signal and a fourth output signal having a same phase as the third output signal, a first combiner configured to combine, by applying a phase difference, the first output signal from the first divider with the third output signal from the second divider, and a second combiner configured to combine, by applying a phase difference, the second output signal from the first divider with the fourth output signal from the second divider.

7. An amplifier comprising:

a signal processing circuit configured to generate an orthogonal signal orthogonal to an input signal;

a first D/A converter configured to convert the orthogonal signal into first analog signal;

a second D/A converter configured to convert the input signal into a second analog signal; and an analog computing circuit configured to generate a constant envelope signal based on the first analog signal from the first D/A converter and the second analog signal from the second D/A converter, and including a first divider configured to divide a first output signal from the first D/A converter into the first output signal and a second output signal having a phase difference with respect to the first output signal, a second divider configured to divide a third output signal from the second D/A converter into the third output signal and a fourth output signal having a same phase as the third output signal, a first combiner configured to combine, by a same phase, the first output signal from the first divider with the third output signal from the second divider, and a second combiner configured to combine, by a same phase second output signal from the first divider with the fourth output signal from the second divider.

8. The amplifier according to claim 1, further comprising:

a first amplifier configured to amplify a fifth output signal from the first combiner;

a second amplifier configured to amplify a sixth output signal from the second combiner; and a third combiner configured to combine the fifth output signal from the first combiner that has been amplified by the first amplifier with the sixth output signal from the second combiner that has been amplified by the second amplifier.

9. The amplifier according to claim 8, further comprising:

a third divider configured to divide a seventh output signal from the third combiner into an eighth output signal and a ninth output signal;

a first subtractor configured to obtain a difference between the eighth output signal obtained by division by the third divider and the input signal; and a second subtractor configured to obtain a difference between the ninth output signal obtained by division by the third divider and a tenth output signal from the first subtractor.

10. A transmitter comprising the amplifier according to claim 1.

11. A base station comprising the transmitter according to claim 10.

12. A transmitter comprising the amplifier according to claim 6.

13. A transmitter comprising the amplifier according to claim 7.

14. A base station comprising the transmitter according to claim 12.

15. A base station comprising the transmitter according to claim 13.

* * * * *